(12) United States Patent
Ogimoto

(10) Patent No.: US 8,872,016 B2
(45) Date of Patent: Oct. 28, 2014

(54) THERMOELECTRIC CONVERSION STRUCTURE AND METHOD OF MANUFACTURING SAME

(75) Inventor: Yasushi Ogimoto, Higashiyamato (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 0 days.

(21) Appl. No.: 13/878,966

(22) PCT Filed: Apr. 6, 2012

(86) PCT No.: PCT/JP2012/059520
§ 371 (c)(1),
(2), (4) Date: Jun. 6, 2013

(87) PCT Pub. No.: WO2012/157369
PCT Pub. Date: Nov. 22, 2012

(65) Prior Publication Data
US 2013/0247952 A1    Sep. 26, 2013

(30) Foreign Application Priority Data
May 19, 2011    (JP) .................................. 2011-111943

(51) Int. Cl.
*H01L 35/04* (2006.01)
*H01L 35/34* (2006.01)
*C30B 29/32* (2006.01)

(52) U.S. Cl.
CPC .............. *H01L 35/04* (2013.01); *H01L 35/34* (2013.01); *C30B 29/32* (2013.01)
USPC ............ 136/208; 136/201; 136/203; 136/205

(58) Field of Classification Search
USPC .................. 136/238, 201, 203, 205
See application file for complete search history.

(56) References Cited

U.S. PATENT DOCUMENTS

| | | | |
|---|---|---|---|
| 2004/0206387 A1* | 10/2004 | Funakubo | 136/236.1 |
| 2005/0081906 A1* | 4/2005 | Adachi et al. | 136/238 |
| 2007/0102034 A1* | 5/2007 | Kanno et al. | 136/203 |
| 2008/0210285 A1* | 9/2008 | Hosono et al. | 136/239 |
| 2009/0173932 A1* | 7/2009 | Ohta et al. | 257/15 |

FOREIGN PATENT DOCUMENTS

| | | |
|---|---|---|
| JP | 2000-159600 A | 6/2000 |
| JP | 2004-296629 A | 10/2004 |

OTHER PUBLICATIONS

H. Ohta et al., "Giant thermoelectric Seebeck coefficient of a two-dimensional electron gas in $SrTiO_3$", Nature Materials, vol. 6, No. 2, pp. 129-134, Feb. 2007.

T. Okuda et al., "Large thermoelectric response of metallic perovskites: $Sr_{1-x}La_xTiO_3$ (0<x<0.1)", Physical Review B, vol. 63, pp. 113104-1 to 113104-4, Mar. 2001.

* cited by examiner

*Primary Examiner* — Golam Mowla
(74) *Attorney, Agent, or Firm* — Rabin & Berdo, P.C.

(57) ABSTRACT

A thermoelectric conversion material in a wire structure or quasi-one-dimensional structure is fabricated simply and with good reproducibility. In one mode of the present invention, a thermoelectric conversion structure 100 is provided, having a $SrTiO_3$ substrate 10 having a (210) plane substrate surface and having a concave-convex structure including (100) plane terrace portions 12, 14 and step portions 16 extending along the in-plane [001] axis of the substrate surface, and a thermoelectric conversion material 22 formed on the surface of at least a portion of the concave-convex structure.

6 Claims, 8 Drawing Sheets

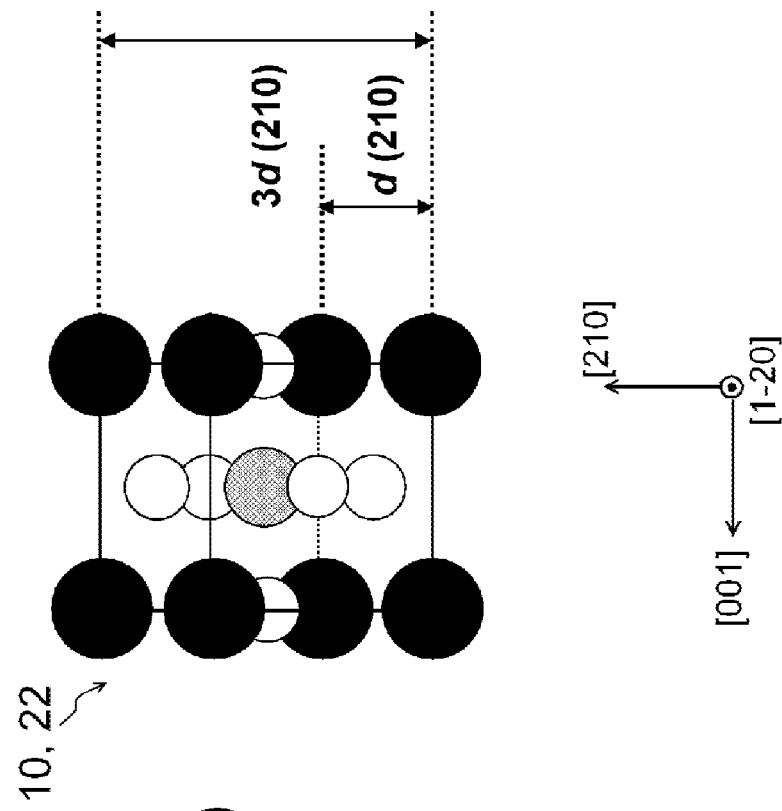
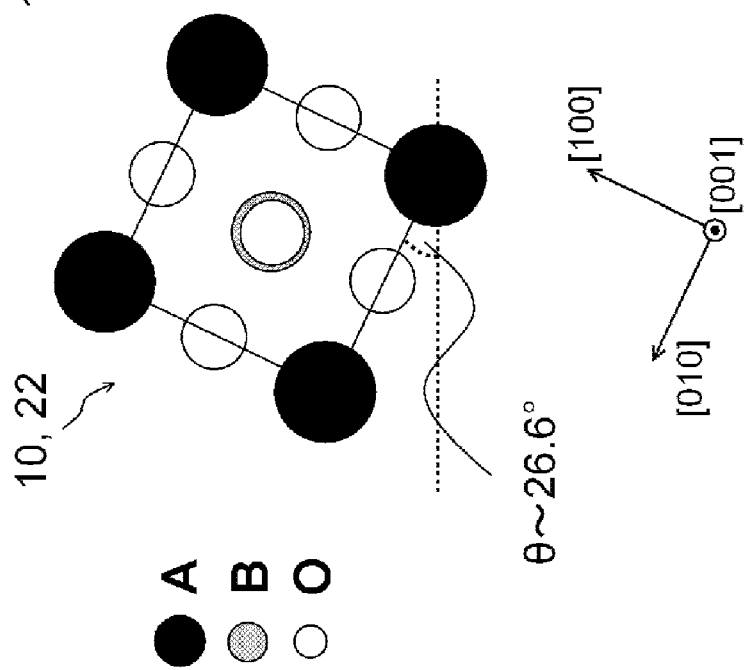

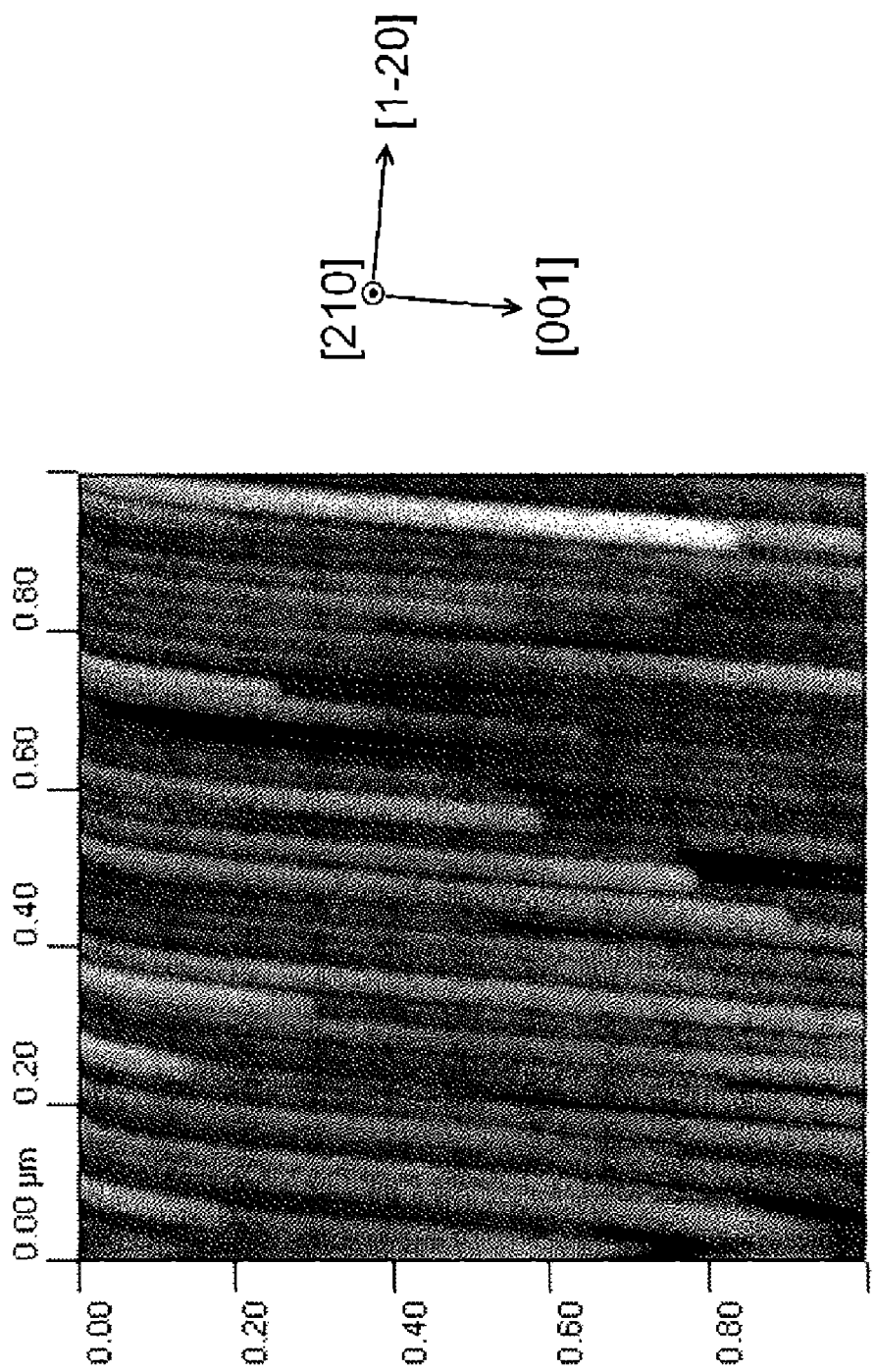

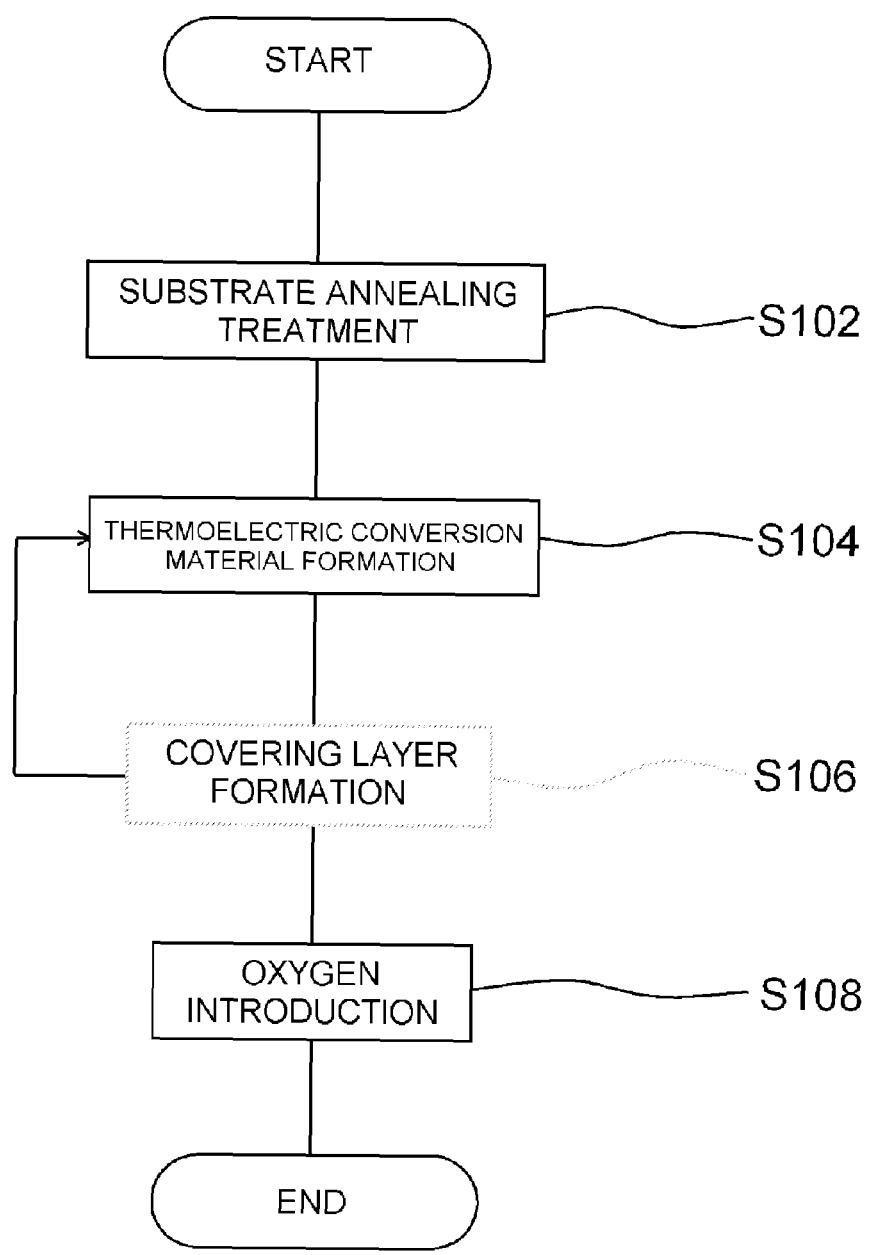

THERMOELECTRIC CONVERSION STRUCTURE AND METHOD OF MANUFACTURING SAME

TECHNICAL FIELD

The present invention relates to a thermoelectric conversion structure and to a method of manufacturing such a structure. More specifically, the present invention relates to a thermoelectric conversion structure, used, for example, in an electricity generation element which uses differences in ambient temperature, and to a method of manufacturing such a structure.

BACKGROUND ART

In recent years energetic research has been conducted on so-called energy harvesting techniques for recovering electric power from waste energy, such as vibrations and heat, which normally is merely dissipated. For example, utilization is anticipated in vibration-generated power, which can be used as a power source for automobile tire pressure gauges and ubiquitous sensor networks, for example. On the other hand, thermoelectric generated power is applied only in niche fields such as for example watches which utilize the temperature differences between the human body and the environment. One reason for this is the low performance of the thermoelectric conversion materials used in thermoelectric elements. The performance index (or figure of merit) of thermoelectric conversion materials is expressed by $$Z = S^2/(\rho \cdot \kappa) \quad \text{equation (1)}$$

Here S is the Seebeck coefficient ($\mu$V/K), $\rho$ is the resistivity ($\Omega$-cm), and $\kappa$ is the thermal conductivity (W/(m·K)). The units of the figure of merit Z are $K^{-1}$, and as the efficiency of a thermoelectric element using a thermoelectric conversion material, often ZT, the product of the figure of merit and the usage temperature T (K), is used. The efficiency ZT of a conventional thermoelectric element using bulk material as the thermoelectric conversion material is approximately 1. It is thought that if a thermoelectric conversion material with efficiency ZT exceeding 3 could be fabricated, such a material could be substituted for compressors and other cooling systems used for example in refrigerators.

Satisfactory thermoelectric conversion materials have a large Seebeck coefficient S and low values of both resistivity and thermal conductivity. $Bi_2Te_3$ is a semimetal material which is representative of thermoelectric conversion materials currently in use. However, $Bi_2Te_3$ system materials are toxic and have a high environmental impact. Hence oxide materials which can be used as safer thermoelectric conversion materials have been attracting interest of late. One such material is $SrTiO_3$, a petrovskite type oxide with an $ABO_3$ structure, doped with La at the A sites (Non-Patent Reference 1: T. Okuda et al, Phys. Rev. B, Vol. 63, 113104 (2001)). This material is a degenerate semiconductor with the n-type conduction.

Further, there have been theoretical proposals of methods to reduce the dimensions of the nano-scale structures of thermoelectric conversion materials, in order to improve the efficiency ZT of thermoelectric elements. Thermoelectric conversion materials have actually been trial-fabricated having a two-dimensionalized structure by using superlattices, and having a one-dimensional structure using whiskers. In these thermoelectric conversion materials, by reducing the dimensionality of the material microstructure and manipulating the state density distribution of conduction carriers, both an increase in the Seebeck coefficient S and reduction of the resistivity $\rho$ are achieved. Further, by reducing the dimensionality of the microstructure of a thermoelectric conversion material, phonon scattering is increased and the thermal conductivity $\kappa$ is lowered. That is, in a thermoelectric conversion material having a microstructure of reduced dimensionality, an increase in the value of the above-described figure of merit Z is attained. In particular, it has been reported that by adopting $Bi_2Te_3$ as a thermoelectric conversion material and fabricating a two-dimensionalized structure, the efficiency ZT has exceeded 2.

Further, it has been reported that even when adopting an oxide as a thermoelectric conversion material, by utilizing a two-dimensionalized structure, the efficiency ZT is increased (see Non-Patent Reference 2: H. Ohta et al, Nature Mater., Vol. 6, 129). Non-Patent Reference 2 reports that a superlattice comprising an n-type thermoelectric conversion material in which the B sites of $SrTiO_3$ were doped with Nb and insulating $SrTiO_3$ had an efficiency ZT of approximately 0.3, that when limited to the superlattice interfaces in particular the efficiency ZT exceeded 2, and that $Ca_3Co_4O_9$ (a p-type thermoelectric conversion material) whiskers exhibited an efficiency ZT of approximately 1. Through advances in thin film technologies in recent years, even in the case of oxide thermal conversion materials, fabricating superlattices (two-dimensional structures) such as those described above using oxides is not difficult. However, if an oxide is adopted in an attempt to fabricate a high-efficiency thermal conversion element, a number of problems arise. First, if an oxide is adopted, it is difficult to fabricate a one-dimensional structure, having dimensionality lower than two dimensions. Specifically, in order to fabricate a one-dimensional structure in an oxide, one conceivable method is to adopt a quantum wire which uses as a template a step of a step-terrace structure of a substrate. However, in order to use this method, fabrication conditions must be controlled such that film deposition in what is called step flow mode is realized. These fabrication conditions are conditions to always cause thin film growth only from the step portion, and consequently the process window is narrow and precise condition control is necessary. As a separate problem, linearity of substrate steps is not always ensured, and there is the problem that the linearity of quantum wires fabricated using such steps as a template is similarly not ensured.

As a method to resolve these problems, Patent Reference 1 (Japanese Patent Application Laid-open No. 2004-296629) discloses a method in which a single-crystal substrate inclined by a slight angle (from 0.2 to 15°) from an arbitrary face orientation is used. In this method, step bunching perpendicular to the inclination direction which is formed on the single crystal is utilized (see for example paragraph [0013] in Patent Reference 1). However, judging from the contents of the disclosure, what is formed on the inclined single-crystal surface disclosed in Patent Reference 1 are ordinary steps, and not bunched steps. In Patent Reference 1 it is stated that a buffer layer surface of a nonconductive material, fabricated on the single crystal inclined by a slight angle (0.2 to 15°), is used as the specific means of forming bunched steps, and that the bunching of steps formed can be used to fabricate thermoelectric conversion material with a wire structure. However, in the disclosure of Patent Reference 1, the reason for formation of bunched steps on the single crystal inclined by a slight angle (0.2 to 15°) is not disclosed.

Patent Reference 1: Japanese Patent Application Laid-open No. 2004-296629

Non-Patent Reference 1: T. Okuda et al, "Large thermoelectric response of metallic perovskites: Sr1-xLaxTiO3 (0<x<0.1)", Phys. Rev. B, Vol. 63, 113104 (2001)

Non-Patent Reference 2: H. Ohta et al, "Giant thermoelectric Seebeck coefficient of a two-dimensional electron gas in SrTiO3", Nature Mater., Vol. 6, 129 (2007)

The method of Patent Reference 1 above has the following problems. That is, (1) because step bunches are not formed on the substrate, a buffer layer must be formed. Further, (2) the linearity in the direction of extension of the bunched steps formed on the buffer layer is not ensured as the linearity in normal steps are not ensured. Hence even if bunched steps were formed, using the method of Patent Reference 1, a wire shape would not necessarily be determined with stability. Further, (3) in order to form in a wire shape the thermoelectric conversion member comprising thermoelectric conversion material extending along bunched steps, fabrication conditions must be controlled precisely so as to result in a step flow mode. Specifically, if there is two-dimensional growth not only from the step edge but also from the terrace surface, there are such problems as irregularity in the intervals between the thermoelectric conversion member wires, and merging of steps, so that wire widths change. In order to prevent such problems and cause growth to occur in the step flow mode, the conditions of fabrication of the thermoelectric conversion material must be controlled with high precision.

DISCLOSURE OF THE INVENTION

This invention was devised in light of the above-described goals. By providing a thermoelectric conversion structure formed of the thermoelectric conversion material and fabricated easily and with good reproducibility to take the electronic structure of a quasi-one-dimensional structure, that is, a wire structure, this invention contributes to improvement of the performance of thermoelectric elements adopting such thermoelectric conversion structures.

The inventor of this application examined the abovementioned problems, and considered that step bunching, in which steps are formed on a buffer layer on a single crystal substrate inclined by a slight angle (from 0.2 to 15°), does not constitute a genuine solution. The inventor then realized that in order to easily fabricate a wire structure with good reproducibility using an oxide thermoelectric conversion material, forming a concave-convex structure defined by the crystal axes and crystal planes of the substrate surface is effective, and moreover discovered that in order to do so, using (210) orientation $SrTiO_3$ as the substrate is effective.

In other words, in one mode of this invention, a thermoelectric conversion structure is provided comprising a $SrTiO_3$ substrate having a (210) plane substrate surface and having a concave-convex structure including terrace portions on (100) planes and step portions extending along the in-plane [001] axis of the substrate surface, and a thermoelectric conversion material disposed on the surface of at least a portion of the concave-convex structure.

In this mode, a concave-convex structure, comprising (100) plane terrace portions and step portions extending along the in-plane [001] axis, is formed on the substrate surface, which is a (210) plane of $SrTiO_3$. This concave-convex structure has height differences as great as for example 12 unit cells. Moreover, the minute surfaces forming the concave-convex structure are terrace portions comprising (100) faces and step portions extending along the [001] axis, that is, are defined by the crystal axes and crystal faces. This concave-convex structure is used as a template for the thermoelectric conversion member. That is, the thermoelectric conversion member is formed on the surface of at least a portion of the concave-convex structure. At this time, formation of a buffer layer or similar is unnecessary. Further, in the concave-convex structure, the linearity of the shape of the thermoelectric conversion material forming the thermoelectric conversion member is secured. This is because step portions are formed along the [001] axis.

In such a thermoelectric conversion member, an electron distribution is obtained the dimensionality of which is further reduced from a two-dimensional electronic system. That is, in for example a two-dimensional electronic system formed by a conventional one-dimensional superlattice (multilayer film) structure, the direction of the in-plane [001] axis and the direction perpendicular thereto in the plane were equivalent. On the other hand, for the electronic structure of the thermoelectric conversion member in the thermoelectric conversion structure of this mode, these two directions are not equivalent due to the influence of the concave-convex structure. The in-plane anisotropy causes a difference in the macroscopic electrical conduction characteristics of the thermoelectric conversion member. According to studies by the inventor of this application, this difference in electrical conduction characteristics affects the Seebeck coefficient. Further, the effect of anisotropy expressed by the electrical conduction characteristics can be clearly detected not only at low temperatures, but in the room-temperature region (for example, approximately 300 K) as well. Hereafter, an arbitrary structure which causes a macroscopic difference in electrical conduction characteristics due to the further reduced dimensionality of a two-dimensional electronic system, as with a concave-convex structure of this mode, is called a quasi-one-dimensional structure.

A (210) orientation substrate is a substrate the surface of which is a (210) plane, represented as the indices of a face of the substrate crystal lattice. Here, the substrate surface is the plane in which the surface of interest of the substrate substantially extends. For example, when some microscopic structure is formed on the surface of interest of the substrate, the face characterizing the surface of the substrate as a whole, and not the inclination of a separate minute surface characterizing the microscopic structure, is the substrate surface. Further, for example miscut angles or other orientation shifts due to errors remaining from fabrication are tolerated when determining the substrate surface. Using a specific example to explain a (210) orientation substrate, a (210) orientation substrate is a substrate in which the crystal lattice orientation (hereafter "orientation") is determined such that the Miller indices specifying the substrate surface are (210).

The (100) plane of the crystal lattice in the substrate of this mode is inclined greatly, by approximately 26.6°, from the (210) plane of the substrate surface. That is, tracing the substrate surface in the [1-20] axis direction, a (100) plane terrace portion is divided into numerous short segments, and steps with large height differences are formed, as step portions or similar, between the terrace portions. Hence even when there is two-dimensional growth in the (100) plane, the thermoelectric conversion material thus grown is a meandering film which is interrupted at the step positions. In this way, thermoelectric conversion material grown on the concave-convex structure of the substrate effective forms a thermoelectric conversion member with a one-dimensional structure even when formed, for example, under conditions for two-dimensional growth on a (100) plane. Details of this mechanism are explained below using an example. Hence in this mode, due to simplicity similar to that when fabricating a two-dimensional structure, a one-dimensional structure can be fabricated with good reproducibility. By this means, in this mode the figure of merit Z of an oxide thermoelectric conversion material can be increased.

Further, in one mode of the invention, the abovementioned thermoelectric conversion structure is provided, further comprising a $SrTiO_3$ covering layer having on a surface an additional concave-convex structure formed corresponding to the aforementioned concave-convex structure and formed to a thickness of 5 unit cells or more so as to cover the aforementioned thermoelectric conversion material, and an additional thermoelectric conversion material disposed on the surface of at least a portion of the additional concave-convex structure at the surface of the covering layer.

By means of this mode, thermoelectric conversion members assuming a wire structure and disposed on a concave-convex structure at the surface of a (210) orientation $SrTiO_3$ substrate can be accumulated without making direct contact by means of a multilayer structure. From a thermal standpoint, it is still more preferable that the covering layer thickness be 10 unit cells or more.

Further, in one mode of this invention, the abovementioned thermoelectric conversion structure is provided, wherein the thickness of the thermoelectric conversion material is 3 unit cells or less when measured in the direction of the [100] axis of the aforementioned substrate.

By means of this mode, a thermoelectric conversion structure is realized with a more strongly expressed advantageous result of reduced dimensionality and higher figure of merit Z.

In addition, in one mode of this invention, the abovementioned thermoelectric conversion structures is provided, wherein the aforementioned thermoelectric conversion material is either $SrTiO_3$ doped with at least one among La, Pr and Nd at A sites, or $SrTiO_3$ dopes with Nd at B sites.

By means of this mode, the lattice constant of the thermoelectric conversion material is close to that of $SrTiO_3$ which is the material of the substrate, so that numerous layers of wire structure thermoelectric conversion members with good crystallinity and $SrTiO_3$ insulating these can be stacked. By this means, the number of lines of thermoelectric conversion members per unit volume, that is, the accumulation degree, can be raised while maintaining a high figure of merit Z.

In addition, in one mode of the invention, a method of manufacturing a thermoelectric conversion structure is provided. That is, a method of manufacturing a thermoelectric conversion structure is provided which includes a step of annealing a $SrTiO_3$ substrate having a (210) plane substrate surface in air and thereby forming a concave-convex structure including (100) plane terrace portions and step portions extending along the in-plane [001] axis of the substrate surface, and a step of disposing a thermoelectric conversion material on the surface of at least a portion of the concave-convex structure.

Further, in one mode of the invention, a method of manufacturing a thermoelectric conversion structure is provided which includes a step of forming a $SrTiO_3$ covering layer so as to cover the aforementioned thermoelectric conversion material and thereby to form an additional concave-convex structure, which corresponds to the aforementioned concave-convex structure, on the surface of the covering layer, and a step of disposing an additional thermoelectric conversion material on the surface of at least a portion of the additional concave-convex structure at the surface of the covering layer.

In each of the modes of this invention, in the perovskite type crystal lattice denoted by $ABO_3$, as the A site a cube having oxygen atoms at each face center position forming an oxygen octahedron, and more generally a parallelepiped, is considered, with lattice points positioned at the vertices of the parallelepiped or similar.

In each of the modes of this invention, a thermoelectric conversion structure is provided comprising a wire structure or a quasi-one-dimensional structure. By this means, a thermoelectric conversion structure exhibiting a high figure of merit Z, and a thermoelectric conversion element using such a structure, are realized.

BRIEF DESCRIPTION OF THE DRAWINGS

FIG. 2 shows schematic side views of the crystal lattice with (210) plane orientation in a $SrTiO_3$ cubic perovskite structure of the substrate an embodiment of the invention, in which FIG. 2A is a side view seen from the in-plane [1-20] axis and FIG. 2B is a side view seen from the in-plane [001] axis;

FIG. 3 is an AFM image of the surface of the (210) plane orientation of a $SrTiO_3$ substrate after annealing in air for 12 hours at 1180° C., in one embodiment of the invention;

FIG. 8 is a flowchart showing a procedure for fabrication of a thermoelectric conversion structure in one embodiment of the invention.

BEST MODE FOR CARRYING OUT THE INVENTION

Figure 1:
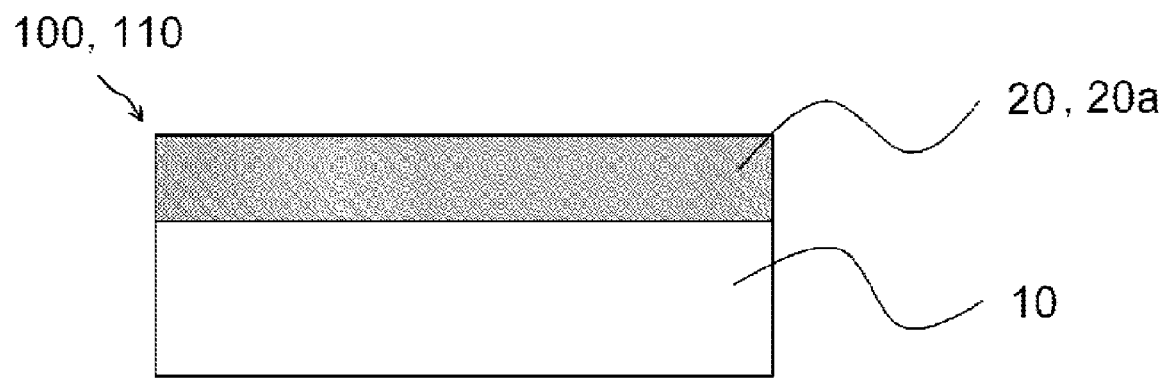
FIG. 1 is a schematic cross-sectional view of the thermoelectric conversion element of an embodiment of the invention.

Below, embodiments of thermoelectric conversion structures of this invention are explained. In the following explanations, unless stated otherwise, portions or elements common to all the drawings are assigned common reference symbols. Further, in the drawings, elements of embodiments are not necessarily shown to scale.

<First Embodiment>

Below, an embodiment of a thermoelectric conversion structure of this embodiment is explained based on the drawings. Herein is explained a thermoelectric conversion structure wherein a concave-convex structure defined by the [001] axis and (100) planes is formed at the surface of a (210) orientation SrTiO$_3$ substrate, and on the surface thereof is fabricated La-doped SrTiO$_3$ as a thermoelectric conversion material to fabricate a wire structure thermoelectric conversion member. In particular, in this embodiment the ability to form the thermoelectric conversion member having a quasi-one-dimensional structure easily and reproducibly using the concave-convex structure is explained.

[1 Structure]

[1-1 Overall Structure]

First, the configuration of the thermoelectric conversion structure of this embodiment is explained. FIG. 1 is a schematic cross-sectional view showing the configuration of the thermoelectric conversion structure 100 of this embodiment. The thermoelectric conversion structure 100 comprises a substrate 10 and a thermalelectric conversion material 20 formed on the surface of the substrate 10. As explained below, the substrate 10 is a substrate of SrTiO having in the surface a microscopic concave-convex structure. A thermalelectric conversion member 20 is formed so as to be in contact with the surface of this SrTiO$_3$ substrate. In FIG. 1, the vertical direction in the plane of the paper is perpendicular to the substrate plane, and the horizontal direction is parallel to the substrate plane. The thermoelectric conversion member 20 is formed from La-doped SrTiO$_3$ thermoelectric conversion material, has substantially the same lattice constant as the SrTiO$_3$ of the substrate 10, and is grown epitaxially on the surface of the substrate 10.

[1-2 Crystal Structure]

Next, the (210) orientation in the cubic perovskite structure is explained referring to FIG. 2. This cubic perovskite stricture is the crystal structure of the substrate 10, which in this embodiment is a SrTiO$_3$ substrate and La dope SrTiO$_3$ thermalelectric conversion material 22. The perovskite structure is denoted by ABO$_3$, where A atoms occupy vertices, the B atom is at the body center, and O (oxygen) atoms occupy each of the face center positions. In the explanation of this embodiment, vertex sites are called A sites, and atoms occupying these sites are called A atoms. The vertical direction in the plane of the paper is taken to be the direction perpendicular to the substrate plane (hereafter called the "direction perpendicular to the surface"); FIG. 2A is a cross-sectional view seen from the in-plane [001] axis, and FIG. 2B is a cross-sectional view seen from the in-plane [1-20] axis orthogonal thereto. In this cubic perovskite structure, the angle of the (100) plane measured from the (210) plane is given by equation (2).

$$\theta = \arctan(1/2) \quad \text{equation (2)}$$

That is, θ is approximately 26.6°, and atomic planes are stacked in alternation as AO-BO$_2$-AO . . . in the direction perpendicular to the surface. In the SrTiO$_3$ (210) substrate 10, the plane interval of (210) planes in the direction perpendicular to the surface is found from $$d(210) = a \cdot \sin \theta \quad \text{equation (3)}$$

and is approximately 0.1746 nm. Here a is the SrTiO$_3$ lattice constant (=0.3905 nm). Taking the view that the cubic crystal unit cell is inclined approximately 26.6° from the (100) orientation, the interval in the direction perpendicular to the surface, 3d(210), is approximately 0.5238 nm. The length in the direction perpendicular to the surface taking in-plane atom position periodicity into consideration, 5d(210), is approximately 0.873 nm.

The lattice constants above are almost identical to each other in also the thermalelectric material 22 forming the thermalelectric conversion member 20.

[1-3 Surface Structure of Substrate]

Figure 4:
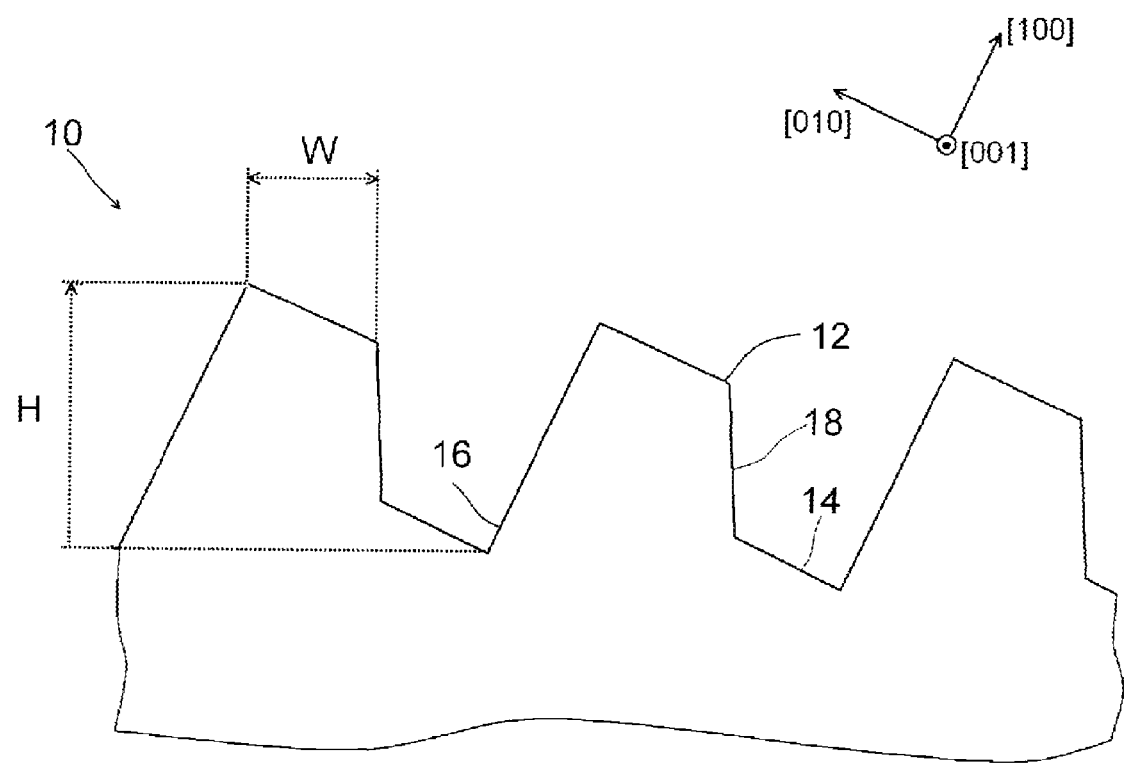
FIG. 4 shows a concave-convex structure comprising a (100) plane terrace portion and a step portion parallel to the [001] axis direction, formed in the surface of a (210) orientation $SrTiO_3$ substrate after annealing in air for 12 hours at 1180° C., in one embodiment of the invention.

Next, the surface structure of the substrate 10, which is a SrTiO$_3$ (210) orientation substrate, is explained. FIG. 3 shows an AFM image of the surface of the substrate 10 used in the thermoelectric conversion structure 100 of this embodiment. FIG. 4 is a schematic cross-sectional view showing with enlargement the structure near the surface of the single crystal 10. As shown in FIG. 4, the (100) plane terrace portions on the substrate 10 are formed as top terrace portions 12 and bottom terrace portions 14 (hereafter "top" and "bottom" are not explicitly indicated). Further, a concave-convex structure including step portions 16 extending along the in-plane [001] axis of the substrate surface is formed on the substrate 10.

In the thermoelectric conversion structure 100, the terrace portions 12 and 14 on (100) planes of the substrate surface and the step portions 16 extending parallel to the in-plane [001] axis are not formed in the procurement stage. That is, the surface of the substrate in the procurement stage is flat at the nanometer level, and no regular structure is observed. Upon annealing this SrTiO$_3$ (210) substrate in air at 1180° C. for 12 hours, a concave-convex structure such as seen in FIG. 3 and FIG. 4 is observed. Specifically, as shown in FIG. 4, narrow terrace portions 12, 14 the width W of which is approximately 20 nm and of length 1 μm or greater extend in the [001] axis direction in the surface of the substrate 10. Measurement of the difference in heights H when tracing the surface in the direction of the [1-20] axis indicates that the difference in heights is approximately 6 nm. This difference in heights H thus formed, converted into the number of unit cells of the SrTiO$_3$ which is the material of the substrate 10, is fixed at approximately 12. And as shown in FIG. 4, in the surface of the substrate 10, the numerous terrace portions 12, 14 are all formed exposing a (100) plane, and the numerous terrace portions 12, 14 are all connected together by step portions 16 and reverse-step portions 18. Of these step portions, the step portions 16 are formed by (001) planes. On the other hand, there is uncertainty as to what relationship the planes of the reverse-step portions 18 has relative to the crystal axes. However, the concave-convex structure is definitely formed by combining the terrace portions 12, 14 and step portions 16, 18 so as to result in large height differences H, and the step portions 18 have inclinations as if the reverse of the step portions 16. The terrace portions 12, 14 and step portions 16, 18 all extend in the [001] axis direction, and are disposed so as to be arranged in the [1-20] axis direction. In comparison with the faces of the step portions 18, the step portions 16 are clearly related to the (010) plane of the crystal lattice, and so compared with the step portions 18, the step portions 16 extend with higher reliability in the direction of the [001] axis.

[1-4 Thermoelectric Conversion Member Structure]

Figure 5:
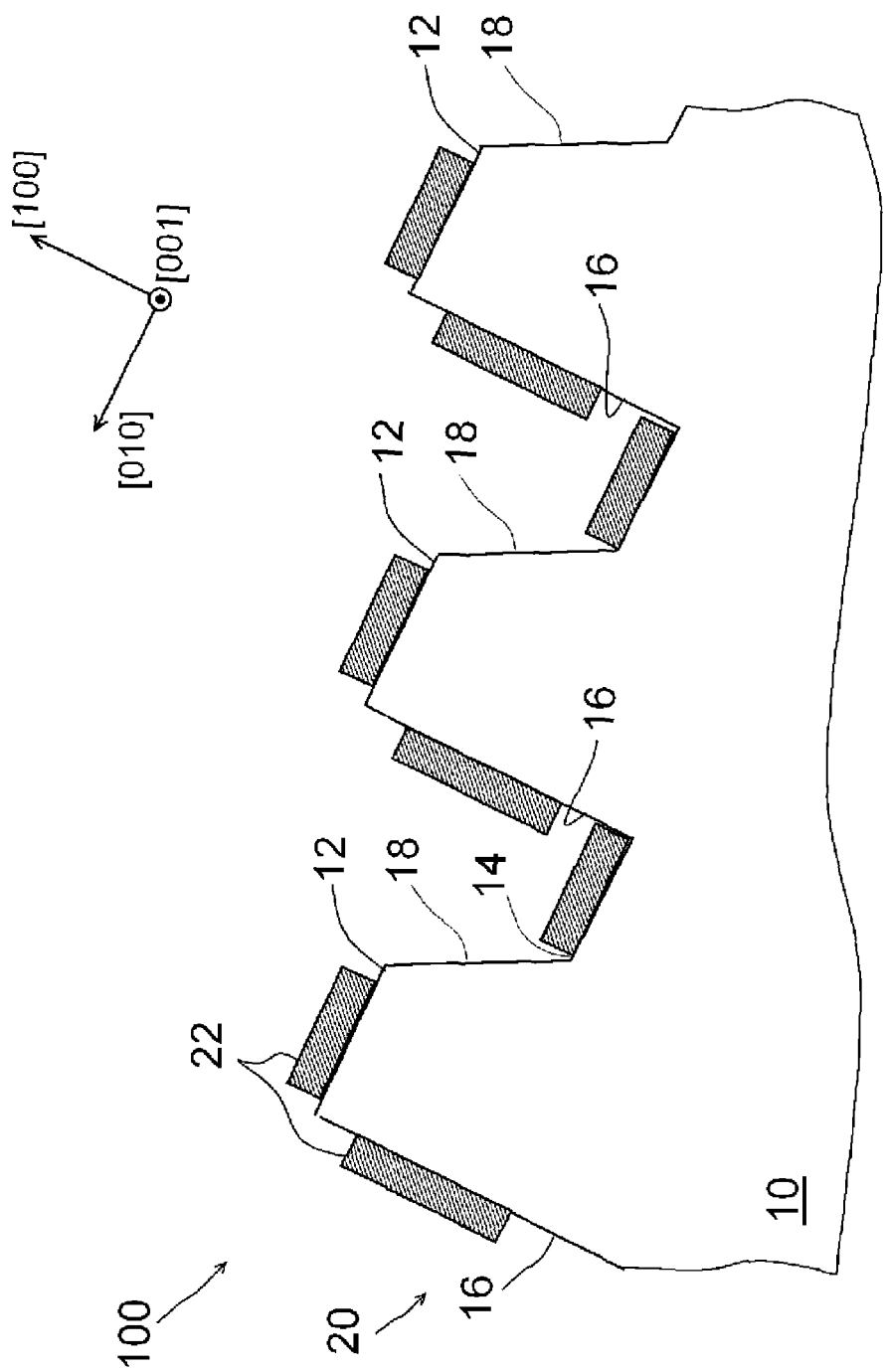
FIG. 5 is a summary cross-sectional view of the structure of a thermoelectric conversion element having a thermoelectric conversion member, comprising La-doped $SrTiO_3$ (thermoelectric conversion material) formed so as to assume a quasi-one-dimensional structure on a concave-convex structure, comprising (100) plane terrace portions and step portions parallel to the [001] axis direction, on a $SrTiO_3$ (210) orientation substrate surface in one embodiment of this invention.

FIG. 5 shows as a cross-sectional view the configuration of a thermoelectric conversion member 20 formed on a substrate 10. That is, the thermoelectric conversion structure 100 has a thermoelectric conversion member 20 including La-doped SrTiO$_3$ (thermoelectric conversion material 22), formed so as to assume a quasi-one-dimensional structure on a concave-convex structure comprising (100) plane terrace portions 12, 14 and step portions 16, 18 parallel to the [001] axis direction on a SrTiO$_3$ (210) orientation substrate surface. The thermoelectric conversion member 20 typically has a structure in which numerous long narrow strips of the thermoelectric conversion material 22 are arranged. The thermoelectric conversion material 22 is formed on the surface of the concave-convex structure comprising terrace portions 12, 14 of (100) planes of the SrTiO$_3$ (210) orientation substrate surface, and step portions 16 of (100) planes. The thermoelectric conversion material 22 covers at least a portion of the surface of the concave-convex structure.

FIG. 5 is a cross-sectional view of a case in which each of the long narrow strips of the thermoelectric conversion material 22 of the thermoelectric conversion member 20 extending in the [001] axis direction is cut by the plane perpendicular to the [001] axis. A current flows in the thermoelectric conversion material 22 forming the thermoelectric conversion member 20 in the length direction, that is, perpendicular to the plane of the paper in FIG. 4 and FIG. 5, and thermoelectric conversion is performed. And due to formation on the concave-convex structure at the surface of the above-described substrate 10, the thermoelectric conversion material 22 has a quasi-one-dimensional structure. Because of this quasi-one-dimensional structure, a satisfactory value is obtained for the efficiency ZT of the thermoelectric conversion structure 100. That is, each of the long narrow strips of the thermoelectric conversion material 22 is an electron-rich degenerate semiconductor, and a quasi-one-dimensional structure is introduced into the electron spatial distribution as well. Due to this highly anisotropic electronic structure, the efficiency ZT of the thermoelectric conversion structure 100 is increased.

Figure 6:
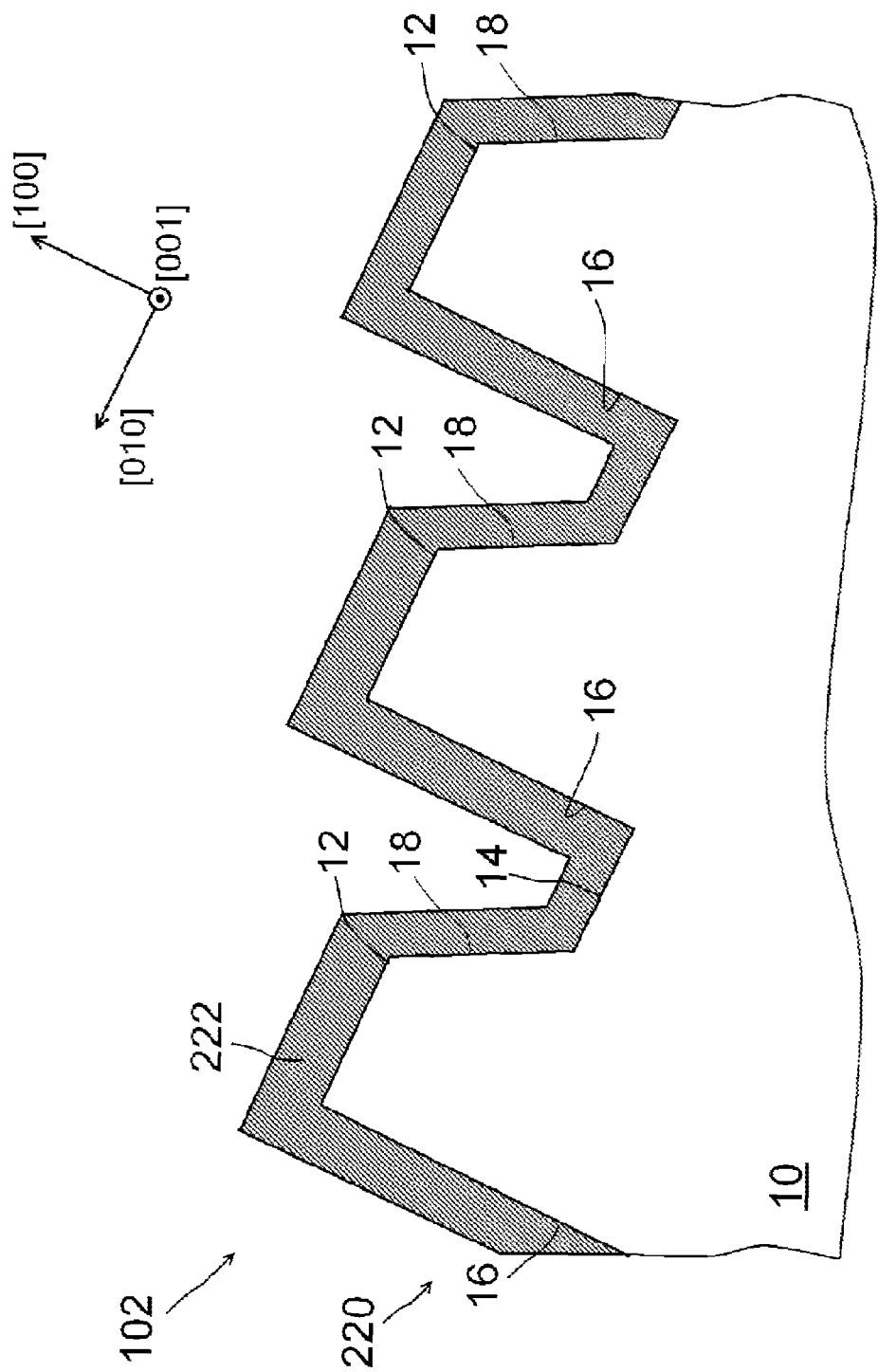
FIG. 6 is a summary cross-sectional view of the structure of a thermoelectric conversion element having a thermoelectric conversion member comprising La-doped $SrTiO_3$ (thermoelectric conversion material) formed so as to assume a quasi-one-dimensional structure of a separate mode on a concave-convex structure, in one embodiment of the invention.

In a separate representative thermoelectric conversion member 20 of a thermoelectric conversion structure 100, there is also a case in which there is no separation into long narrow strips, as with the thermoelectric conversion material 22 shown in FIG. 5. For example, FIG. 6 shows a thermoelectric conversion structure 102 having a thermoelectric conversion member 220 of another structure formed so as to be in contact with the surface of the concave-convex structure similarly to FIG. 5 and assumes a quasi-one-dimensional structure. In the thermoelectric conversion structure 102, the thermoelectric conversion member 220 includes thermoelectric conversion material 222 formed so as to cover the terrace portions 12, 14 and step portions 16, 18 which form a concave-convex structure. This thermoelectric conversion material 222 is film formed along the concave-convex structure, and so is affected thereby, and the electron conduction characteristics differ greatly along the [001] axis (the direction perpendicular to the plane of the paper) and the [1-20] axis (the right-left direction in the plane of the paper). Such an effect appears prominently when the thickness of the thermoelectric conversion material 222 is as thin as approximately 3 unit cells, defined as measured for example in the [100] axis direction at the (100) plane terrace portions 12. In this way, in the thermoelectric conversion structure of this embodiment, gaps resulting in discontinuity need not necessarily be formed in the concave-convex structure surface of the thermoelectric conversion material in contact with the surface of the concave-convex structure, as with the thermoelectric conversion material 22 shown in FIG. 5.

[1-5 Modified Example of Thermoelectric Conversion Member]

Figure 7:
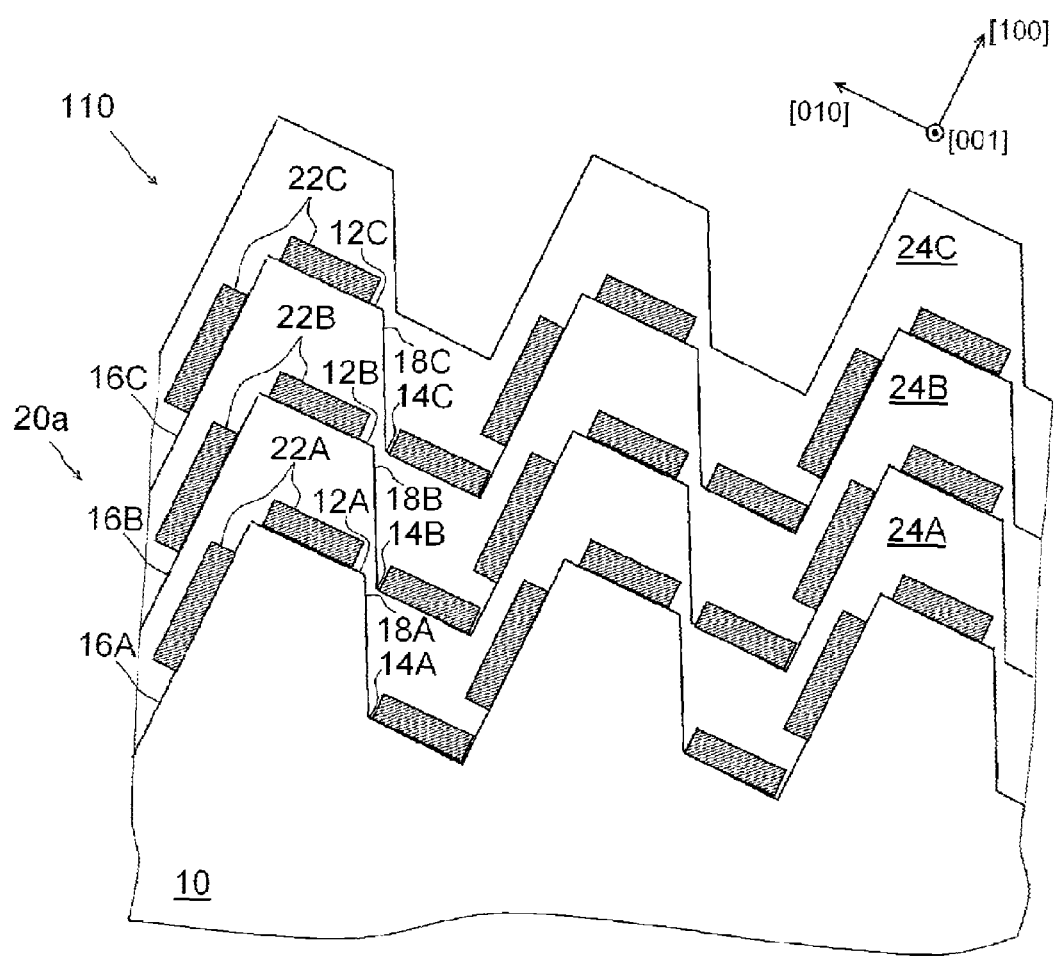
FIG. 7 is a summary cross-sectional view of a thermoelectric conversion structure having thermoelectric conversion members comprising La-doped $SrTiO_3$ (thermoelectric conversion material) accumulated and formed in quasi-one-dimensional structures on a concave-convex structure comprising (100) plane terrace portions and step portions parallel to the [001] axis of a $SrTiO_3$ (210) orientation substrate surface, in one embodiment of this invention.

FIG. 7 shows a summary cross-sectional view of the thermoelectric conversion structure 110 of a modified example of this embodiment. As shown in FIG. 7, in the thermoelectric conversion structure 110 of this embodiment, accumulated thermoelectric conversion materials 22 (22A to 22C) using terrace portions 12A, 14A and step portions 16A, 18A formed on the substrate 10 can be adopted, as in the thermoelectric conversion member 20a. In order to fabricate this thermoelectric conversion structure 110, similarly to the thermoelectric conversion structure 100 shown in FIG. 5, thermoelectric conversion material 22A of La-doped SrTiO$_3$ is formed on the surface of at least a portion of the concave-convex structure including the terrace portions 12A, 14A and step portions 16A. Then, the SrTiO$_3$ covering layer 24A is formed so as to cover the thermoelectric conversion material 22A.

Here, the representative covering layer 24A is formed to a thickness of 5 unit cells or greater. The covering layer 24A is grown such that continuous crystals of the thermoelectric conversion material 22A are formed, and by this means an additional concave-convex structure is formed corresponding to the concave-convex structure of the substrate 10. That is, the SrTiO$_3$ covering layer 24A is grown epitaxially on the La-doped SrTiO$_3$ thermoelectric conversion material 22A. In the initial stage of forming this covering layer 24A, the gaps in the thermoelectric conversion material 22A are buried by the covering layer 24A. Then, when the covering layer 24A is formed to a certain degree, a structure similar to the concave-convex structure formed by the terrace portions 12A and 14A and step portions 16A and 18A is formed, as if being formed by similar material, to bury the gaps between the thermoelectric conversion material 22A. Then, when the covering layer 24A is formed, the covering layer 24A covers the thermoelectric conversion material 22A, and an additional concave-convex structure is obtained with only the material properties of the covering layer 24A at the surface position. This additional concave-convex structure includes terrace portions 12B, 14B and step portions 16B, 18B. Hence by using the additional concave-convex structure as an underlayer, the additional thermoelectric conversion material 22B can be formed. In this case also, by forming the covering layer 24B so as to cover the additional thermoelectric conversion material 22B, the further additional thermoelectric conversion material 22C can also be formed by repetition.

In this modified example, the structures of the thermoelectric conversion materials 22A to 22C, which are La-doped SrTiO$_3$, assume quasi-one-dimensional structures particularly effectively when the film thicknesses are 3 unit cells or less. This is because the (100) plane is inclined from the (210) plane by approximately 26.6°, and the shape when tracing the (100) plane terrace portions 12, 14 is not linear, so that the La-doped SrTiO$_3$ corresponding to a film thickness of 3 unit cells or less, formed on the surfaces of the terrace portions 12, 14 and the bottoms and side faces of the steps, is cut. When a thermoelectric conversion member 20a with such an accumulated structure is adopted, there is the advantage that the overall efficiency ZT of the thermoelectric conversion structure 110 is raised. In the thermoelectric conversion structure 110 also, when thermoelectric conversion is performed by the thermoelectric conversion materials 22A to 22C forming the thermoelectric conversion member 20a, current flows in the length direction of the thermoelectric conversion materials 22A to 22C, that is, perpendicular to the plane of the paper in FIG. 7.

[2 Method Of Manufacture]

Next, a method of manufacturing a thermoelectric conversion structure 100 and thermoelectric conversion structure 110 of this embodiment is explained. FIG. 8 is a flowchart showing the manufacturing procedure. Manufacturing the thermoelectric conversion structure 100 begins by annealing treatment of a substrate in air as described above, to fabricate a substrate 10 on which is formed a concave-convex structure (S102).

Next, a laser ablation method is used to form thermoelectric conversion material on the concave-convex structure (S104). More specifically, La-doped SrTiO$_3$ is grown on the surface of the concave-convex structure as the thermoelectric conversion material 22 to be formed. At this time, a disc 20 mm in diameter and 5 mm thick of a polycrystalline material, obtained by using a solid phase reaction method to produce multicrystal material, is used as the target such that a La doping volume is at 10%. As the detailed procedure, first the substrate 10, which is a SrTiO$_3$ (210) substrate, is mounted in a vacuum chamber, which is evacuated to $3\times10^{-9}$ Torr ($4\times10^{-7}$ Pa) or lower. Then, high-purity oxygen gas is introduced into the vacuum chamber to 100 mTorr (13.3 Pa), and the substrate 10, on which the concave-convex structure is already formed, is heated to a final temperature of 750° C. The temperature of the substrate 10 during this film deposition is lower than the 1180° C. temperature used in annealing the substrate during formation of the concave-convex structure, so that the concave-convex structure formed in the surface of the substrate 10 is not affected by the abovementioned heating of the single crystal during the laser ablation method. Next, the target is irradiated via a laser light introduction port in the chamber with 135 pulses of light from a KrF excimer laser of wavelength 248 nm, to grow La dope SrTiO$_3$ on the concave-convex structure to a film thickness equivalent to 3 unit cells. These conditions are decided by confirming in advance that irradiation of 45 pulses by the excimer laser is sufficient to cause two dimentional growth of La dope SrTiO$_3$ one unit cell on the abovementioned substrate having a flat surface (100).

In growth of this thermoelectric conversion material 22, conditions are selected such that the thermoelectric conversion material 22, having substantially the same lattice constant as SrTiO$_3$, is grown epitaxially on the substrate 10 of SrTiO$_3$. To this end, in order to confirm crystallinity during growth of the thermalelectric conversion material 22, in situ observations by RHEED (reflection high-energy electron diffraction) are effective. That is, the substrate 10, which is a (210) orientation substrate, is anisotropic, and when an electron beam is incident parallel to the in-plane [001] axis, diffraction by the (1-20) planes is obtained. When such observations are actually made, diffraction patterns from for example the (100) planes and the (010) planes are seen. This diffraction pattern can be confirmed to be formed by the thin film of the thermalelectric conversion material 22 in a configuration including (100) plane terrace portions 12, 14 and (010) plane step portions 16 similarly to the concave-convex structure in the surface of the substrate 10, that is, in a template of the concave-convex structure of the substrate 10. Similarly, in RHEED patterns, by making the beam incident parallel to the in-plane [1-20] axis, information relating to the in-plane (001) plane is also obtained. When the electron beam is made incident parallel to the [1-20] axis, a RHEED pattern comprising streaks is observed, and it is confirmed that a quasi-one dimentional structure can be obtained in which flat epitaxial growth occurs at nm levels on the substrate without forming steps in the [001] axis direction. As a result, it is confirmed that a concave-convex structure such as that shown in FIG. 4 is obtained.

Thereafter, annealing is performed in situ at 400° C., and oxygen is added (S108). As explained above, the concave-convex structure is formed so as to have sufficiently large height differences, so that in the thermalelectric conversion member 20 formed thereupon, the thickness of the thermalelectric conversion material 22 formed on the surface of the concave-convex structure of the substrate 10 is regulated by the film thickness in the direction perpendicular to the surface. Further, thermalelectric conversion materials 22 which are adjacent in the [1-20] direction are separated by the height differences created by the step portions 16, 18 of the concave-convex structure. In this way, a quasi-one-dimensional structure is formed.

The thermoelectric conversion structure 100 can be fabricated by the above processes (S102, S104, S108). Here, when fabricating the thermoelectric conversion structure 110 of the above-described modified example, following the process S104, a process of forming a covering layer (S106) is executed. In this case, in the same vacuum chamber, a SrTiO$_3$ target is used to similarly form a covering layer 24A equivalent to 10 unit cells. The covering layer 24A together with the thermoelectric conversion material 22A forms an epitaxial crystal lattice on the concave-convex structure of the substrate 10. When the sequence of the processes 5104 and S106 is repeated three times, the thermoelectric conversion structure 110, a cross-sectional view of which appears in FIG. 7, is formed.

[3 Example And Comparative Example]

Below, the invention is explained in detail for the case of an example. The materials, amounts used, proportions, details of treatments, treatment procedures, and the orientations and specific dispositions of elements or members, and similar described in the following example can be modified appropriately without deviating from the gist of the invention. Hence the scope of the invention is not limited to the following specific example. A sample of the example was fabricated having the same structure as the above-described thermoelectric conversion structure 110, and the figure of merit Z of the thermoelectric conversion structure of the example sample was determined. Specifically, Al electrodes were formed on both ends of the example sample in the [001] axis direction, and the Seebeck coefficient S, resistivity $\rho$ and thermal conductivity $\kappa$ of the thermoelectric conversion member 20$a$ were measured at room temperature (300 K) via the Al electrodes. As a result, an efficiency ZT of approximately 4.6 (T=300 K) is measured, far superior to the efficiency ZT of approximately 0.3 (and if limited only to the superlattice interface, ZT>2) reported for a superlattice comprising Nb-doped SrTiO$_3$ and SrTiO$_3$. As a reason for obtaining such characteristics, the inventor of this application consider that the electronic state of the La-doped SrTiO$_3$ which is thermoelectric conversion material of this invention has been effectively made quasi-one-dimensional. Further, similarly to the above, the excellent values of 5.8 and 4.3 are obtained (T=300 K) for the efficiency ZT of samples doped with 10% Pr and Nd, respectively, at A sites. As the reason why the best efficiency was obtained when doping with Pr, it is thought that because the Pr ionic radius is small compared with La, strain in the oxygen octahedron comprising TiO$_6$ is increased. That is, due to the improvement in mobility arising from strain, the reduction in resistivity and reduction in thermal conductivity are thought to contribute to improvement of the efficiency ZT. On the other hand, it should be noted that for samples doped with 10% Nb at B sites, an efficiency ZT of 2.9 (T=300 K) is obtained, which while smaller than for the case of doping at A sites, is nonetheless excellent.

As explained above, in the thermoelectric conversion material (here, La-doped SrTiO$_3$) formed on the surface of the concave-convex structure defined by the step portions extending along the [001] axis and the (100) plane terrace portions of the substrate surface of (210) orientation SrTiO$_3$, a quasi-one-dimensional structure is formed. Further, a SrTiO$_3$ insulating layer is formed on this thermoelectric conversion material, and by repeating this sequence, thermoelectric conversion material with a quasi-one-dimensional structure can be accumulated. However, as previously explained, a concave-convex structure with large height differences can be formed easily and with good reproducibility merely by annealing the (210) orientation SrTiO$_3$ substrate in air. This is because steps are formed autonomously by the crystal axes and crystal surfaces. Further, this concave-convex structure differs from normal step portions and bunched step portions in that the height on terrace portions is not uniform in the [1-20] axis direction, so that merely by depositing thermoelectric conversion material under two-dimensional growth conditions, discontinuity occurs due to step portions. Consequently, the concave-convex structure can be fabricated easily and reliably. Hence compared with two-dimensional structure fabrication, a quasi-one-dimensional structure, that is, a wire structure, can be fabricated without requiring special equipment or processes, and thermoelectric conversion material with improved performance is obtained. The compositions, film thicknesses, methods of formation and similar of the thermoelectric conversion materials described in this embodiment are not limited to those in the above description of the embodiment.

The materials and compositions, film thicknesses, methods of formation and similar of the thin films and substrates exemplified in this embodiment are not limited to those of the abovementioned embodiment. Further, as is known by a person skilled in the art, the names of the axes and planes of the perovskite crystals described for purposes of explanation can be represented by other equivalent representations. For example, even when a crystal axis extending along the surface of a substrate is represented as a [001] axis, two settings for the axis, which are mutual inversions, are conceivable. Further, for each of the settings of the [001] axis, there is arbitrariness in the settings of the [100] axis and the [010] axis. Hence when for example a right-hand system is used to determine an axis, the plane represented as the (m10) plane, represented by a separate axis representation method based on a right-hand system, becomes the (1m0) plane, and thus it must be remembered that separate representations are possible for equivalent planes.

In the above, embodiments of the invention have been explained in detail. The above-described embodiments and examples are set forth to explain the invention, and the scope of the invention of this invention should be determined based on the scope of claims. Further, modified examples existing within the scope of the invention, including other combinations of embodiments, are also included in the scope of claims.

INDUSTRIAL APPLICABILITY

This invention can be used as a thermalelectric conversion structure for a thermoelectric conversion element which generates electricity using temperature differences in an environment.

EXPLANATION OF REFERENCE NUMERALS 100, 102, 110 Thermoelectric conversion structure
10 Single crystal
12, 12A, 12B, 12C (100) plane (top terrace portion)
14, 14A, 14B, 14C (100) plane (bottom terrace portion)
16, 16A, 16B, 16C Step portion ((010) plane)
18, 18A, 18B, 18C Step portion (reverse-step)
20, 20a, 220 Thermoelectric conversion member
22, 222, 22A, 22B, 22C La-doped $SrTiO_3$ (thermoelectric conversion material of quasi-one-dimensional structure)
24, 24A, 24B, 24C Covering layer

The invention claimed is:

1. A thermoelectric conversion structure, comprising:
   a $SrTiO_3$ substrate having a (210) plane substrate surface and having a concave-convex structure including a (100) plane terrace portion and a step portion extending along an in-plane [001] axis of the substrate surface; and
   a thermoelectric conversion material disposed on a surface of at least a portion of the concave-convex structure.

2. The thermoelectric conversion structure according to claim 1, further comprising:
   a $SrTiO_3$ covering layer formed to a thickness of at least 5 unit cells so as to cover the thermoelectric conversion material, the $SrTiO_3$ covering layer having on a surface thereof an additional concave-convex structure formed corresponding to the concave-convex structure of the $SrTiO_3$ substrate; and
   additional thermoelectric conversion material disposed on a surface of at least a portion of the additional concave-convex structure of a surface of the covering layer.

3. The thermoelectric conversion structure according to claim 2, wherein the thickness of the thermoelectric conversion material, when measured in a direction of a [100] axis of the substrate, is 3 unit cells or less.

4. The thermoelectric conversion structure according to claim 3, wherein the thermoelectric conversion material is either $SrTiO_3$ doped with at least any of La, Pr and Nd at an A site, or $SrTiO_3$ doped with Nd at a B site.

5. A method of manufacturing a thermoelectric conversion structure, comprising the steps of:
   annealing a $SrTiO_3$ substrate having a (210) plane substrate surface in air and thereby forming a concave-convex structure including a (100) plane terrace portion and a step portion extending along an in-plane [001] axis of the substrate surface; and
   disposing a thermoelectric conversion material on a surface of at least a portion of the concave-convex structure.

6. The method of manufacturing a thermoelectric conversion structure according to claim 5, further comprising the steps of:
   forming a $SrTiO_3$ covering layer so as to cover the thermoelectric conversion material and thereby forming an additional concave-convex structure, which corresponds to the concave-convex structure, on a surface of the covering layer; and
   disposing additional thermoelectric conversion material on a surface of at least a portion of the additional concave-convex structure.

* * * * *